United States Patent [19]

Martin et al.

[11] Patent Number: 5,494,833
[45] Date of Patent: Feb. 27, 1996

[54] BACKSIDE ILLUMINATED MSM DEVICE METHOD

[75] Inventors: Eric A. Martin, Medford; Kenneth Vaccaro, Acton; Joseph P. Lorenzo, Stow, all of Mass.

[73] Assignee: The United States of America as represented by the Secretary of the Air Force, Wright-Patterson Air Force Base, Ohio

[21] Appl. No.: 274,889

[22] Filed: Jul. 14, 1994

[51] Int. Cl.$^6$ ................................................ H01L 31/18
[52] U.S. Cl. ...................... 437/2; 437/3; 437/6; 437/209; 437/974; 148/DIG. 135
[58] Field of Search ............................. 437/2, 3, 6, 209, 437/974; 148/DIG. 135; 257/449, 460, 461, 462, 466

[56] References Cited

U.S. PATENT DOCUMENTS

| | | | |
|---|---|---|---|
| 4,618,877 | 10/1986 | Araki et al. | 437/6 |
| 4,678,542 | 7/1987 | Boer et al. | 257/449 |
| 4,695,861 | 9/1987 | Paine et al. | 257/460 |
| 4,794,439 | 12/1988 | Webb et al. | 257/461 |
| 5,130,259 | 7/1992 | Bahraman | 437/2 |
| 5,141,878 | 8/1992 | Benton et al. | 437/3 |
| 5,304,500 | 4/1994 | Timlin et al. | 257/460 |

OTHER PUBLICATIONS

Jong–Wook et al in the IEEE Photonics Technology Letters, vol. 4, No. 8, Aug. 1992.

*Primary Examiner*—Kevin M. Picardat
*Attorney, Agent, or Firm*—Gerald B. Hollins; Thomas L. Kundert

[57] ABSTRACT

An improved Metal Semiconductor Metal (MSM) photodiode device and a fabrication process for realizing this device. The improved photodiode device employs frontside electrodes and backside illumination to avoid active area shadowing in the device. This configuration is achieved through a device fabrication sequence which involves substrate removal—and replacement at the device's opposed frontside surface using such media as an epoxy adhesive. The disclosed device uses gallium arsenide semiconductor materials that are lattice determined by an indium phosphide sacrificial initial substrate, in order to select a desired input energy spectral range.

10 Claims, 1 Drawing Sheet

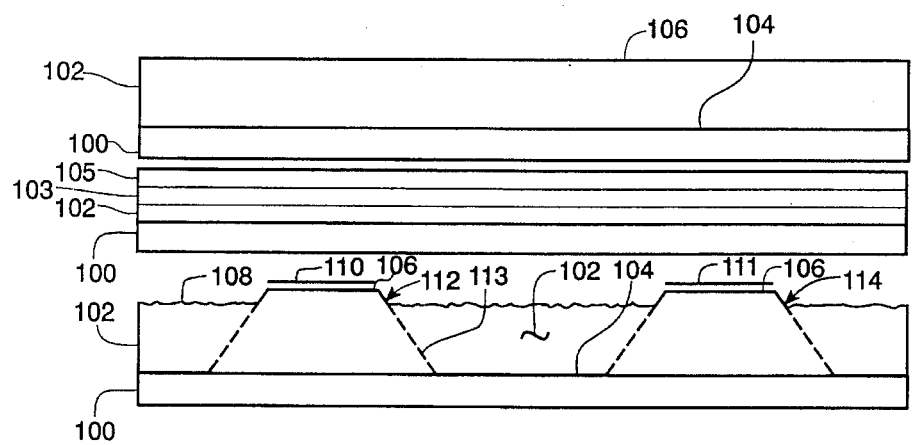
Fig. 1A
Fig. 1B
Fig. 1C
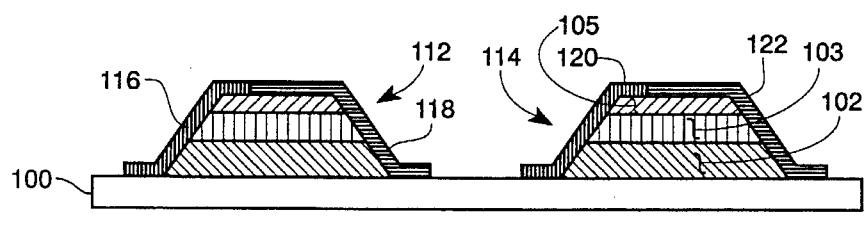
Fig. 1D
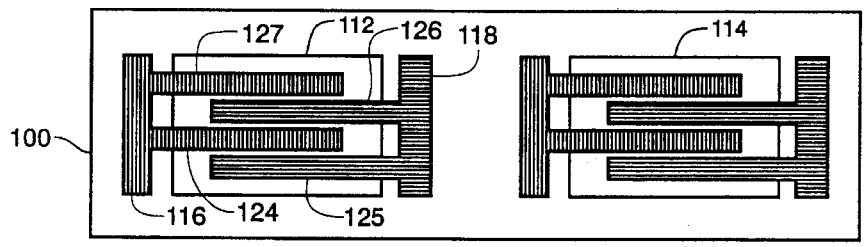
Fig. 1E
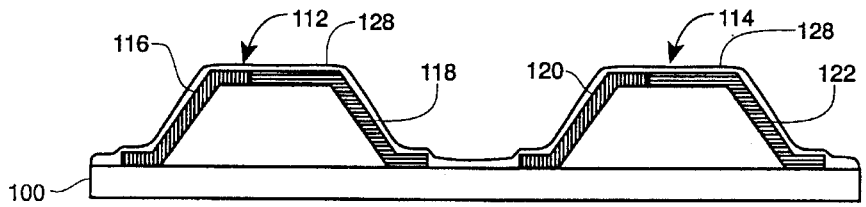
Fig. 1F
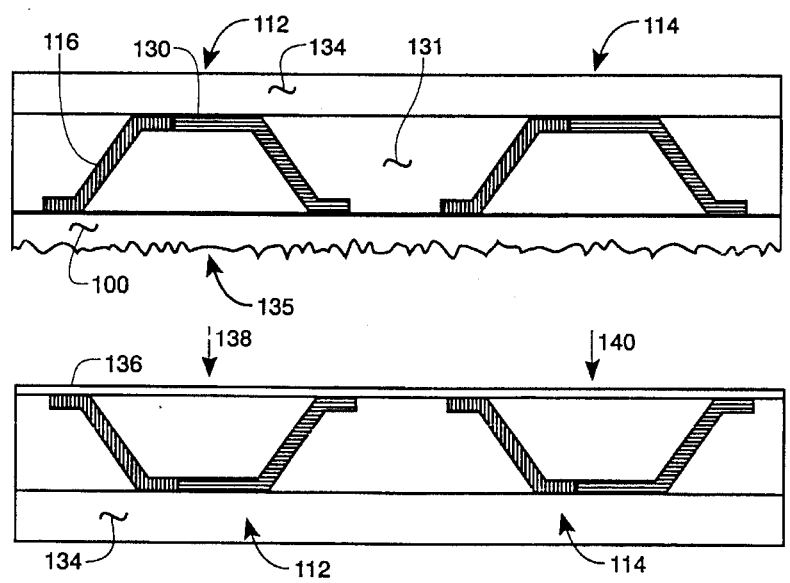
Fig. 1G
Fig. 1H

BACKSIDE ILLUMINATED MSM DEVICE METHOD

RIGHTS OF THE GOVERNMENT

The invention described herein may be manufactured and used by or for the Government of the United States for all governmental purposes without the payment of any royalty.

CROSS REFERENCE TO RELATED APPLICATION

The present document is somewhat related to the copending and commonly assigned applications "FET Optical Receiver Using Backside Illumination, Indium Material Species", Ser. No. 08/274,930; Backside Illuminated FET Optical Receiver and Method with Gallium Arsenide Species, Ser. No. 08/274,931; and "Wafer Joined Opto-Electronic Integrated Circuits and Method", Ser. No. 08/274,882; which are filed of even date herewith in the names of different inventor entities. The contents of these related applications are hereby incorporated by reference herein.

BACKGROUND OF THE INVENTION

This invention relates to the field of optical to electrical signal transducer devices and their fabrication in the form of an improved metal semiconductor metal (MSM) device.

High data rate optical communications systems require high-speed optical receivers for information transmittal. These receivers must have an integral high-speed optical detector to convert the optical signal to an electrical signal. Semiconductor diodes are currently preferred for use as these detectors. The semiconductor Indium Gallium Arsenide (InGaAs) grown lattice matched or near lattice matched to Indium Phosphide (InP) is a desirable material for such diodes due to its internal electron speed and its efficient absorption of radiation in the 1.3–1.6 micrometer wavelengths favorable to optical fiber communications. The presence of metal electrodes on the front surface of currently available embodiments of these devices, however, reduces their optical collection efficiency through shadowing. Backside illumination of such detectors is therefore to be preferred. Semiconductor PIN photodiodes are currently the most widely used detector for optical communications. These diodes must comprise regions of both n-type (electron rich) and p-type (hole rich) semiconductor material. Although this material requirement is compatible with bipolar transistor technology, it is highly inconsistent or non-compatible with Field Effect Transistor (FET) technology. To be integrable with the now preferred FET circuits for amplifying, switching and other electrical signal processing functions, the detector must be unipolar in nature.

Photoconductors are unipolar detectors but suffer from very slow response times and often have high dark current characteristics—a feature which reduces available signal-to-noise ratio. Metal Semiconductor Metal (MSM) detectors are back-to-back Schottky diodes typically formed as interdigitated metal fingers (gates). These devices are fully compatible with FET processing yet do possess disadvantages: the metal fingers shadow illumination from reaching the absorbing InGaAs region within the device. These devices also have the disadvantage of providing no electrical signal gain. In many uses, however, high optical signal levels and electrical amplification can be used to overcome this disadvantage.

Even though the photo FET device, especially the versions of the photo FET disclosed in the above-identified copending patent documents, overcomes this zero electrical gain characteristic of a photodiode, there is yet a large need for an improved photodiode device in the electronic art. The structure and theoretical simplicity of such photodiodes, especially when configured according to the present invention, and their relatively small size assures continued application of such diodes in electronic systems for an extended time.

MSM devices in frontside illuminated configuration have been known in the semiconductor device art for several years. A device of this type which further includes transparent electrodes in order to prevent electrode shading effects is described by Jong-Wook et al in the IEEE Photonics Technology Letters, Vol. 4, No. 8, Aug 1992. Devices of this type have incurred process-related difficulties, however, and also tend to show large leakage currents.

The prior art has therefore not provided an MSM photodetector device which provides the increased optical energy response, ease of fabrication and other desirable characteristics that are available from the replaced substrate, flipped over, and backside surface illuminated MSM devices of the present invention.

SUMMARY OF THE INVENTION

The present invention provides both an improved MSM photodiode device and a fabrication process for realizing this device. The improved photodiode device employs backside illumination to avoid active area shadowing. This configuration is achieved through a fabrication sequence which involves substrate removal—and replacement on the device's opposed frontside surface using such media as an epoxy adhesive.

It is therefore an object of the invention to provide an improved, more efficient optical-to-electrical transducer device of the photodiode and MSM types.

It is another object of the invention to provide a substrate-removal inclusive fabrication process for realizing this improved transducer device.

It is another object of the invention to provide an indium phosphide lattice determined MSM device.

It is another object of the invention to provide a backside illuminated MSM photodiode device.

It is another object of the invention to provide a gallium arsenide material-based photodiode device.

It is another object of the invention to provide a substrate replacement-derived MSM device.

It is another object of the invention to provide a photodetector device that is process compatible with, wafer integratable with, and concurrently processable with conventional electrical signal amplifying field effect transistor devices.

It is another object of the invention to provide an MSM photodiode device that is process compatible with, wafer integratable with, and concurrently processable with the photo FET device of the above-identified "Backside Illuminated FET Optical Receiver and Method with Gallium Arsenide Species" phototransistor device.

Additional objects and features of the invention will be understood from the following description and claims and the accompanying drawings.

These and other objects of the invention are achieved by the method of fabricating metal semiconductor metal photodetector devices comprising the steps of:

forming on a sacrificial indium phosphide first substrate wafer member an epitaxial indium aluminum arsenide buffer and etch stop layer;

growing on said indium aluminum arsenide layer an optical energy receptive epitaxial layer of indium gallium arsenide;

depositing on said indium gallium arsenide layer a current blocking layer of indium aluminum arsenide;

removing lateral area portions of said formed, grown, and deposited layers down to said first substrate wafer member to define in remaining portions thereof an array of upstanding epitaxial mesa layered areas;

disposing a two-terminal array of interdigitated finger configured metallic electrode elements across an upper plateau surface of each said upstanding epitaxial mesa, each said two-terminal electrode array including a first terminal metal pad portion received on both a lateral side portion of its supporting mesa and on adjoining surface portions of said now exposed first substrate wafer member and a complementing second terminal metal pad portion received on an opposing mesa lateral side and adjoining first substrate wafer surface;

attaching said array of upstanding mesas at said upper plateau surface portions thereof to an electrically insulating permanent second substrate member;

deleting said sacrificial indium phosphide first substrate wafer member from said array of attached mesas to expose backside surface portions of said mesas; and dividing said array of mesa configured devices into groups of photodetectors.

BRIEF DESCRIPTION OF THE DRAWINGS

FIG. 1A shows a first layer addition to a substrate, a preliminary step in the fabrication of photodetector devices according to the invention.

FIG. 1B shows the addition of two other semiconductor layers to the FIG. 1A structure.

FIG. 1C shows the formation of isolated mesas in the FIG. 1B plural layers-covered substrate.

FIG. 1D shows the addition of a two terminal array of metal electrodes to the FIG. 1C structure.

FIG. 1E shows a plan view of the FIG. 1D mesas and a finger configuration for the FIG. 1D metal electrodes.

FIG. 1F shows the addition of a protective or passivation coating to the devices of FIG. 1E.

FIG. 1G shows the addition of adhesive filling material and a second 25 substrate to the FIG. 1F structure, along with commenced removal of the original substrate.

FIG. 1H shows the physical inversion of the FIG. 1G structure, together with the addition of a backside passivation coating.

DETAILED DESCRIPTION

FIG. 1 in the drawings shows a fabrication sequence for indium inclusive metal semiconductor metal (MSM) photo detector devices in accordance with the present invention. Although the photo devices of the FIG. 1 fabrication sequence bear certain similarities to the devices described in the above referred-to and herein incorporated-by-reference companion applications, the following fabrication sequence will clarify certain differences and distinctions in the present invention.

FIG. 1A in the drawings therefore shows a preliminary portion of the fabrication sequence for a photo device according to the present invention. In the FIG. 1A drawing an epitaxial layer 102 having an upper surface 106 has been added to a substrate member 100 at its surface 104. According to optical energy spectral band selection aspects of the invention, it is desirable that the substrate 100 be made of the periodic table Group III–V materials such as indium phosphide and moreover that the material of the epitaxial layer 102 be grown in a lattice matched or near lattice matched relationship with the indium phosphide of the substrate 100. In practice it is found that the herein desired first layer semiconductor material, indium aluminum arsenide (InAlAs), can be grown in this lattice matched or near lattice matched condition without great difficulty; such material when so grown provides a photodetector having the desired 1.3 to 1.6 micrometer wavelength spectral response.

Structures of the FIG. 1A type having a lattice matched or near lattice matched epitaxial layer 102 received on an indium phosphide substrate 100 are often fabricated by attaching the epitaxial material to an ethyl or methyl molecule in a loose bonding arrangement that is easily broken or decomposed in a processing furnace to leave the epitaxial layer 102. This process is known in the art and is preferably used in fabrication of the present invention periodic table Group III–V semiconductor materials.

For present invention purposes, the substrate 100 and the epitaxial layer 102 may include doping materials such as iron to reduce conductivity or may be undoped. Semiconductor wafers having these properties, i.e., wafers in which the FIG. 1A step has been accomplished by the supplier, are available from commercial sources to the integrated circuit device fabrication industry, i.e., from source such as Quantum Epitaxial Design Inc. (QED) of Bethlehem, Pa. Material of this type is also available from Epitaxial Products Inc. (EPI) of Cardiff, Wales, UK or the U.S. subsidiary of EPI located in Londonderry, N.H. Three-inch wafers are available from QED and two-inch wafers from EPI. Doping levels for the epitaxial InAlAs material of the layer 102 may be modified to vary the properties of the achieved photodetector devices.

FIG. 1B in the drawings shows the addition of two more epitaxial layers 103 and 105 to the FIG. 1A structure. The layer 103 in FIG. 1B is composed of undoped indium gallium arsenide and is preferably provided with a thickness of 0.2 to 1.0 micrometers. The layer 105 in FIG. 1B is also composed of undoped indium aluminum arsenide (InAlAs) and has thickness of 0.05 micrometers. In the present invention the indium aluminum arsenide layer 102 serves as a buffer layer and etch stop in the fabrication sequence; the indium gallium arsenide layer 103 serves as the light energy absorbing layer and the indium aluminum arsenide layer 105 as a current blocking layer.

FIG. 1C in the drawings shows a composite third step in the fabrication of an MSM device according to the present invention. In the FIG. 1C step, there is shown the photoresist mask portions 110 and 111 by which an etching away of substantial portions of the epitaxial layers 102, 103 and 105 is accomplished. FIG. 1C in fact shows a commencement of this etching away process in its essential absence of the surface 106 and its replacement of this surface with the lower and partially-etched surface 108. In this FIG. 1C etching arrangement, therefore, the portions of the surface 106 residing below the photoresist mask portions at 110 and 111 remain and the etching process is underway. Etching arrangements as represented in FIG. 1C involve the application of photoresist material, the use of a photographic mask, and development or processing of the exposed photoresist material, all as are known and commonly practiced in the semiconductor device art.

The expected additional progression of the etching sequence shown in FIG. 1C to form the two mesas of layered epitaxial material at 112 and 114 is indicated typically at 113 in FIG. 1C. The sloping sides indicated at 113 for the mesa 112 is of course the result of preferential etching rates, as is commonly known for the different lattice orientations (110, 111, etc.) in the semiconductor art.

The mesas 112 and 114 in the FIG. 1C processing step will ultimately become two separate and electrically isolated MSM photodetector devices. These two devices may be separated following completion of the entire FIG. 1 fabrication sequence or may be retained in their illustrated relationship and also may be accompanied by additional of such devices where appropriate to the end usage. In certain applications, for example, there is a need for a matrix of photo devices which are received at predetermined distance intervals across a common substrate member. Notably, separation of the FIG. 1 devices is preferably delayed until after the step of FIG. 1H since processing of multiple devices is much easier to accomplish in wafer form—as is the basis of the present-day integrated circuit art.

FIG. 1D of the drawings shows the addition of non-ohmic contact metal to the fully-formed mesas 112 and 114 of FIG. 1C. The contacts added in FIG. 1D are indicated at 116, 118, 120 and 122 for the mesas 112 and 114. By way of these non-ohmic contact members the electrical signals from the photoconductor mesas 112 and 114 are communicated to a receiving apparatus. As is shown in the plan view of FIG. 1E, the contact members 116 and 118 are connected with an array of interdigitated finger electrode members 124, 125, 126 and 127 that spread over the small trapezoid leg cross-sectional shape of the upper surface plateau of mesas 112 and 114—i.e., spread over the layer 105 of indium aluminum arsenide in the mesas 112 and 114. The two fingers connecting with each contact member as well as the represented physical sizes of the fingers 124, 125, 126 and 127 are of course only suggestive of arrangements which may be used in present invention photodetectors. In a device of the FIG. 1 type when arranged for use in the: fiberoptic communications environment, the array of interdigitated fingers and patterned mesa regions form a photoreceptive area that is made to be comparable in size to the optical pattern emerging from an optical fiber that is located in close proximity, just as in the case of a packaged photoreceiver. Depending upon the optical characteristics and diameter of the fiber, the distance of the fiber from the MSM photodiode, and the presence of any lensing apparatus between fiber and the MSM device, the preferred MSM device size is typically from 10×10 micrometers to 50×50 micrometers.

The width of the fingers 124, 125, 126 and 127 and their separation (i.e. between 127 and 126, and 124 and 125 in FIG. 1E) impact the speed of the achieved photodiode by way of influencing both interelectrode capacitance and electron transit time. Preferably, the present invention MSM photodiodes are provided with equal finger widths and finger separations, of physical size from 1 to 2 micrometers In the present invention, MSM photodiodes the electrode fingers 124, 125. 126 and 128 comprise non-ohmic contacts with the layer 105 indium aluminum arsenide material, i.e. these electrodes in effect each form a reversed bias or non-conducting Shottkey diode with the indium aluminum arsenide semiconductor of the layer 105. In the presence of an applied electrical bias, these electrodes will increase or decrease their current blocking characteristics, for the cases of negative and positive bias, respectively. In the proposed mode of operation, one electrode is held at a zero electrical bias and maintains its current blocking properties. The other electrode is biased positively, reducing its current blocking characteristics. The electric field between the two electrodes thereby tends to sweep photogenerated electrons towards the positively biased electrode (anode) where they are converted into an external electric current.

With electrodes of this character the present invention photodetectors are operated in an electrical circuit by applying a DC bias signal across the contacts 116 and 118 and using the modulation of this bias signal by light energy received in the semiconductor layer 105 as an output electrical signal. Since the effective Shottkey diode at each electrode to semiconductor contact provides an overall equivalent circuit of two back-to-back Shottkey diodes for the FIG. 1 devices, either polarity of the bias signal employed is operative.

The contacts 116 and 118 and the electrode fingers 124, 125, 126 and 127 are preferably fabricated by applying a thin layer of titanium (of 0.05 micrometers thickness for example) by evaporation to the layer 105 semiconductor material and then evaporating a layer of gold over this titanium layer. The gold layer's thickness is not critical, a layer of 0.1 micrometers is satisfactory.

The semiconductor layers 102, 103 and 105 are shown in cross-sectional representation in the mesas 112 and 114 of the FIG. 1D drawing. Actually this cross-section is present in the mesas of each of the views of FIGS. 1C, 1D, 1F, 1G and 1H, however, it is actually represented only in FIG. 1D in the interest of drawing simplicity.

The protective or passivating layer indicated at 128 in FIG. 1F preferably covers each of the mesas 112 and 114 and their non-ohmic contact metal members and provides physical and chemical isolation for the covered portions of the FIG. 1F structure. It is desirable that the passivation layer 128 be fabricated of a material such as silicon dioxide ($SiO_2$), however, it is also desirable in view of the present device's semiconductor materials that this $SiO_2$ layer be formed at considerably lower temperatures than is practiced in the fabrication of silicon semiconductor devices, for example. A process for achieving this low temperature application of the passivating layer 128 is disclosed in U.S. Pat. No. 4,900,591 for example; the contents of this patent are hereby also incorporated by reference herein. The passivation layer 128 also adds desirable mechanical strength to the FIG. 1F structure; in the interest of drawing clarity however, this layer is omitted from the showing of FIG. 1G and subsequent figures herein. The passivation layer 128 may have a thickness of 0.1 micrometer.

An important aspect of the photodetector device fabricated in the FIG. 1 sequence is the attainment of an unencumbered backside region of the epitaxial semiconductor material of the mesas 112 and 114. An unencumbered backside reception of optical energy into the photodetector devices of the FIG. 1 fabrication provides for maximum sensitivity of the device and eliminates the shadowing by metal or other conductors that has occurred in many prior art photodetector devices.

In order to achieve this unencumbered backside optical energy reception, while maintaining the physical spacing between devices, it is desirable to provide a relocated new substrate member for the FIG. 1F structure and to identify the heretofore referred-to substrate 100 as a sacrificial substrate which is to be removed in order to provide this desired unencumbered backside optical energy reception surface. The permanent substrate for the FIG. 1F device is shown at 134 in FIG. 1G and the commencement of removal of the sacrificial substrate member 100 is indicated at 135 in FIG. 1G. The new or permanent substrate member 134 is preferably fabricated of an electrically insulating but preferably thermally conductive material such as glass, a silicon wafer, periodic table Group III, IV or V materials or other electrically insulating rigid substrate materials as are known in the electronic circuit art. It is also possible that the substrate member 134 may be a wafer of a differing technology semiconductor device such as the wafer of a silicon based integrated circuit assembly. This may occur in instances wherein the spectral range of the input light energy dictates use of present invention materials in a silicon realized electronic system, for example.

The new or permanent substrate 134 is attached to the passivation coating 128 of the FIG. 1F structure (or to the exposed semiconductor of layer 105 and the metal of fingers 124–126 if the passivation layer 128 is omitted) using a material such as a filled and thermally conductive epoxy adhesive—as is represented at 131 in the FIG. 1F drawing. This filled and thermally conductive epoxy adhesive serves both to fill the void regions intermediate adjacent mesas of the FIG. 1 structure and also as an adhesive attachment medium in a layer adjacent the permanent substrate 134 for retaining the substrate 134. This attachment is integral with the mesas 112 and 114. An epoxy adhesive such as the type H74 sold by Epoxy Technology Inc. of Billerica, Mass. has been found suitable for use at 131 in the FIG. 1 structure.

Removal of the substrate 100 from the FIG. 1G structure as is indicated at 135 in FIG. 1F, may be accomplished by a combination of polishing (or grinding) and chemical etching wherein the substrate is thinned to a remaining thickness of about 5 micrometers by mechanical abrasion polishing and then etched away with a hydrochloric acid (HCl) etch (4:1 HCl:$H_2O$ or 1.0 HCl:$H_2O$ for example) as is known in the semiconductor art. This etch selectively removes the InP from all areas, including from the metal elements of the device.

FIG. 1H in the drawings shows the photo FET devices of the FIG. 1 fabrication sequence in an optical energy reception surface-up view that is inverted from the FIG. 1F drawing. The unobstructed optical energy access to the semiconductor material of the mesas 112 and 114, the access represented at 138 and 140 in FIG. 1G, is of course, a significant aspect of the FIG. 1 processing sequence. FIG. 1G also shows the addition of a second protection or passivating layer 136 to the now-exposed backside portion of the FIG. 1A–1F mesas 112 and 114. Preferably this passivating layer 136 is also fabricated of silicon dioxide and is fabricated according to the low temperature process of the above incorporated-by-reference U.S. Pat. No. 4,900,591. In addition to the low temperature processing of this silicon dioxide layer being desirable for preservation of the semiconductor materials in the FIG. 1G drawing, it is also desirable that the epoxy material at 131 remain at lower temperatures during application of the layer 136 coating. Prior to application of this layer 136 coating, the photodetector devices of FIG. 1H were of course available for electrical testing and grading if so desired.

In addition to the layer 136 providing passivation protection for the FIG. 1 photo FET devices, it is found that the anti-reflection properties inherently achieved with such a layer provide for an increased reception of optical energy into the semiconductor material of the exposed backside face. Moreover when the somewhat textured surface of the preferred silicon dioxide coating is employed, its additional feature of an intermediate value of refraction index between the layer 105 material and air provides less input energy reflection and an increase of up to 30% in electrical signal output. This passivation coating is also found to add desirable mechanical strength to the FIG. 1 structure.

Table I summarizes the processing steps described in FIG. 1 and generally corresponds with the steps shown in the FIG. 1 drawing. The abbreviations appearing in the Table I sequence are defined in the preceding paragraphs.

TABLE I

| Processing Sequence |
| --- |
| InP Lattice Matched InGaAs/InAlAs on InP |
| 3" InP MBE Materials from QED |
| 2" InP MOCVD Materials from EPI |
| $H_3PO_4$ Mesa Etch |
| Non-Ohmic Contacts |
| Ti/Au |
| Front side Passivation - Low Temperature $SiO_2$ |
| Adhesive Bonding |
| Substrate Removal - Polish + HCl etch |
| Backside Passivation - Low Temperature $SiO_2$ |

Following the removal of the InP substrate 100 in the above process sequence, the detectors may be electrically probed via the exposed contact electrodes and optically illuminated from the same face—the original backside face. The removal of the InP wafer in the present invention also allows access to the backside interface of the device so that electrical potential can be easily manipulated through chemical altering of the surface state density by the described passivation, or by a transparent conductor.

In an alternate arrangement of the invention, wells can be etched into the backside of the device at the detector side. An optical beam can then be focused onto the backside of the device. However, the depth of such a well must be controlled—which imposes one difficulty. Additionally, the photolithographic definition of the hole increases process complexity, and subsequent packaging of the detector must accommodate electrical contact to one surface of the sample and optical illumination of the other—which increases packaging complexity and typical package size.

The present invention therefore provides a photodetector apparatus relatively easy to fabricate, a device also having an unencumbered light reception surface. The invention also achieves this device in the form of a metal semiconductor metal structure that is fully compatible with the processing of one major class of FET amplifying and switching devices. By way of this compatibility with conventional FET devices, it is therefore possible to achieve a photodetector on the same wafer and with the same processing steps as are used in fabricating the remaining areas of the wafer. This compatibility is believed to be a significant advantage over other photodetector arrangements.

The device of the present invention can also be fabricated in discrete component form and added to wafers or other substrates as needed. This may be achieved with use of the invention disclosed in the above referred-to and incorporated by reference patent document titled "Wafer Joined Opto-Electronic Integrated Circuits and Method", for example.

Photodetector devices according to the present invention therefore represent an inherently integratable photodetector for optical control of other electronic circuits including microwave and digital processing circuits. Devices according to the invention therefore find potential application in the fields of optical communication, optical computing, optical control, and other state-of-the-art electronic uses.

While the apparatus and method herein described constitute a preferred embodiment of the invention, it is understood that the invention is not limited to this precise form of apparatus or method and that changes may be made therein without departing from the scope of the invention which is defined in the appended claims.

What is claimed is:

1. The method of fabricating metal semiconductor metal photodetector devices comprising the steps of:

forming on a sacrificial indium phosphide first substrate wafer member an epitaxial indium aluminum arsenide buffer and etch stop layer;

growing on said indium aluminum arsenide layer an optical energy receptive epitaxial layer of indium gallium arsenide;

depositing on said indium gallium arsenide layer a current blocking layer of indium aluminum arsenide;

removing lateral area portions of said formed, grown, and deposited layers down to said first substrate wafer member to define in remaining portions thereof an array of upstanding epitaxial mesa layered areas;

disposing a two-terminal array of interdigitated finger configured metallic electrode elements across an upper plateau surface of each said upstanding epitaxial mesa, each said two-terminal electrode array including a first terminal metal pad portion received on both a lateral side portion of its supporting mesa and on adjoining surface portions of said now exposed first substrate wafer member and a complementing second terminal metal pad portion received on an opposing mesa lateral side and adjoining first substrate wafer surface;

attaching said array of upstanding mesas at said upper plateau surface portions thereof to an electrically insulating permanent second substrate member;

deleting said sacrificial indium phosphide first substrate wafer member from said array of attached mesas to expose backside surface portions of said mesas; and dividing said array of mesa configured devices into groups of photodetectors.

2. The method of claim 1 wherein said disposing step includes an initial layer evaporation of titanium metal and a subsequent layer evaporation of gold metal.

3. The method of claim 1 wherein said deleting step includes an initial polishing and a subsequent chemical etching steps.

4. The method of claim 1 wherein said disposing step is followed by the step of covering said mesas and said metallic electrode elements with a coating of low temperature deposited silicon dioxide.

5. The method of claim 1 wherein said deleting step is followed by the step of covering said exposed mesa backside surface portions with a passivation coating of low temperature deposited silicon dioxide.

6. The method of claim 5 wherein said silicon dioxide has an index of optical refraction intermediate that of indium gallium arsenide and air.

7. The method of claim 1 further including attaching external communication electrical conductor members to exposed backside portions of said metallic electrode elements.

8. The method of claim 1 wherein said attaching step includes forming an electrically insulating thermally conducting adhesive bond between said permanent second substrate member and said upper plateau surface portions.

9. The method of claim 8 wherein said attaching step further includes filling lateral void intervals between said mesas with said electrically insulating thermally conducting adhesive bond material.

10. The method of claim 9 wherein said adhesive bond material is an epoxy adhesive.

* * * * *